(12) United States Patent
Poveda

(10) Patent No.: US 11,329,040 B2
(45) Date of Patent: May 10, 2022

(54) PROTECTION AGAINST ELECTROSTATIC DISCHARGES AND FILTERING

(71) Applicant: STMicroelectronics (Tours) SAS, Tours (FR)

(72) Inventor: Patrick Poveda, Villedomer (FR)

(73) Assignee: STMicroelectronics (Tours) SAS, Tours (FR)

( * ) Notice: Subject to any disclaimer, the term of this patent is extended or adjusted under 35 U.S.C. 154(b) by 535 days.

(21) Appl. No.: 16/359,431

(22) Filed: Mar. 20, 2019

(65) Prior Publication Data

US 2019/0296005 A1 Sep. 26, 2019

(30) Foreign Application Priority Data

Mar. 26, 2018 (FR) ...................................... 1852593

(51) Int. Cl.

| H02H 9/00 | (2006.01) |
| H01L 27/02 | (2006.01) |
| H01L 29/87 | (2006.01) |
| H01L 29/66 | (2006.01) |
| H01L 23/60 | (2006.01) |
| H01L 29/78 | (2006.01) |
| H01L 29/788 | (2006.01) |
| H01L 23/522 | (2006.01) |
| H01L 23/528 | (2006.01) |
| H01L 27/06 | (2006.01) |
| H01L 29/06 | (2006.01) |
| H01L 29/866 | (2006.01) |
| H02H 9/04 | (2006.01) |
| H03H 11/04 | (2006.01) |

(52) U.S. Cl.
CPC ........ *H01L 27/0248* (2013.01); *H01L 23/528* (2013.01); *H01L 23/5227* (2013.01); *H01L 23/60* (2013.01); *H01L 27/0255* (2013.01); *H01L 27/0676* (2013.01); *H01L 29/0649* (2013.01); *H01L 29/66113* (2013.01); *H01L 29/7808* (2013.01); *H01L 29/7821* (2013.01); *H01L 29/7886* (2013.01); *H01L 29/866* (2013.01); *H01L 29/87* (2013.01); *H02H 9/046* (2013.01); *H03H 11/04* (2013.01)

(58) Field of Classification Search
CPC ....................... H01L 27/0255; H01L 29/66113
USPC ........... 438/91, 380; 257/199, 438, 481, 603
See application file for complete search history.

(56) References Cited

U.S. PATENT DOCUMENTS 9,735,291 B1 * 8/2017 Chiou ................. H01L 29/0692
2011/0243120 A1   10/2011 Ginsburg et al.
(Continued)

FOREIGN PATENT DOCUMENTS

EP    2211381 A1    7/2010

OTHER PUBLICATIONS

INPI Search Report and Written Opinion for FR 1852593 dated Nov. 14, 2018 (8 pages).

*Primary Examiner* — Stephen W Jackson
(74) *Attorney, Agent, or Firm* — Crowe & Dunlevy

(57) ABSTRACT

An electronic component includes first and second separate semiconductor regions. A third semiconductor region is arranged under and between the first and second semiconductor regions. The first and third semiconductor regions define electrodes of a first diode. The second and third semiconductor regions define electrodes of a second diode. The first diode is an avalanche diode.

22 Claims, 3 Drawing Sheets

(56) References Cited

U.S. PATENT DOCUMENTS

| | | | |
|---|---|---|---|
| 2014/0363930 A1* | 12/2014 | Bobde | H01L 27/0761 |
| | | | 438/133 |
| 2015/0028460 A1 | 1/2015 | Sharma et al. | |
| 2016/0104700 A1 | 4/2016 | Notermans et al. | |
| 2017/0373492 A1 | 12/2017 | Ueki | |
| 2019/0123556 A1* | 4/2019 | Fang | H01L 27/0255 |

* cited by examiner

PROTECTION AGAINST ELECTROSTATIC DISCHARGES AND FILTERING

PRIORITY CLAIM

This application claims the priority benefit of French Application for Patent No. 1852593, filed on Mar. 26, 2018, the content of which is hereby incorporated by reference in its entirety to the maximum extent allowable by law.

TECHNICAL FIELD

The present disclosure generally relates to electronic circuits, and more particularly to a device for protection against electrostatic discharges.

BACKGROUND

Some electronic circuits, such as integrated circuits, have to be protected against electrostatic discharges. Such electrostatic discharges risk reaching the circuit terminals, and are capable of damaging the circuit.

It is further desired to protect electronic circuits against electromagnetic disturbances which might reach those electronic circuits and affect their operation, or even damage them.

SUMMARY

A device for protection against electrostatic discharges and for filtering electromagnetic disturbances is thus provided which overcoming all or part of the disadvantages of known protection and/or filtering devices.

In an embodiment, an electronic component includes first and second separate semiconductor regions and a third semiconductor region arranged under and between the first and second regions, the first and third regions defining electrodes of a first diode, the second and third regions defining electrodes of a second diode, and the first diode being an avalanche diode.

According to an embodiment, the third region has a lower doping level than the first and second regions.

According to an embodiment, the third region is located on an electrically-insulating layer.

According to an embodiment, the electrically insulating layer covers a support having an electric resistivity greater than 1,500 Ω·cm.

According to an embodiment, the support is a semiconductor wafer.

According to an embodiment, a third diode may be connected in parallel with the first and second diodes.

According to an embodiment, the third diode includes first and second separate semiconductor areas and a third semiconductor area located under and between the first and second areas, the first and second areas defining electrodes of the third diode, and the first and second areas being more heavily doped than the third area.

According to an embodiment, the component includes, under the first region, an additional region of the same conductivity type as the third region and more heavily doped than the third region.

According to an embodiment, a fourth region located above the third region defines an electrode of a Schockley diode, another electrode of which is defined by the second region.

According to an embodiment, the fourth region is not located above the additional region.

According to an embodiment, the fourth region is located in an upper portion of the first region.

According to an embodiment, the fourth region is located in an upper portion of a fifth region of the same type of conductivity as the first and second regions, the third region extending below and between the second and fifth regions.

According to an embodiment, the component has a first contact topping the first region and a second contact connected to the first contact and located astride the fourth region and the first region or the fifth region.

An embodiment provides a device for protection against electrostatic discharges includes at least one component such as above.

An embodiment provides a circuit including the component above.

According to an embodiment, the circuit includes an inductive element in series with the component.

According to an embodiment, the inductive element is arranged on the electrically-insulating layer.

According to an embodiment, no semiconductor portion is located between the electrically-insulating layer and the inductive element.

According to an embodiment, the inductive element is located on a portion of a semiconductor layer arranged on the electrically-insulating layer.

An embodiment provides a device for common-mode filtering and for protection against electrostatic discharges, including first and second circuits above, the inductive elements of the first and second circuits being mutually magnetically coupled.

According to an embodiment, the inductive element of the first circuit includes first conductive tracks, and the inductive element of the second circuit includes second conductive tracks stacked to the first conductive tracks.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
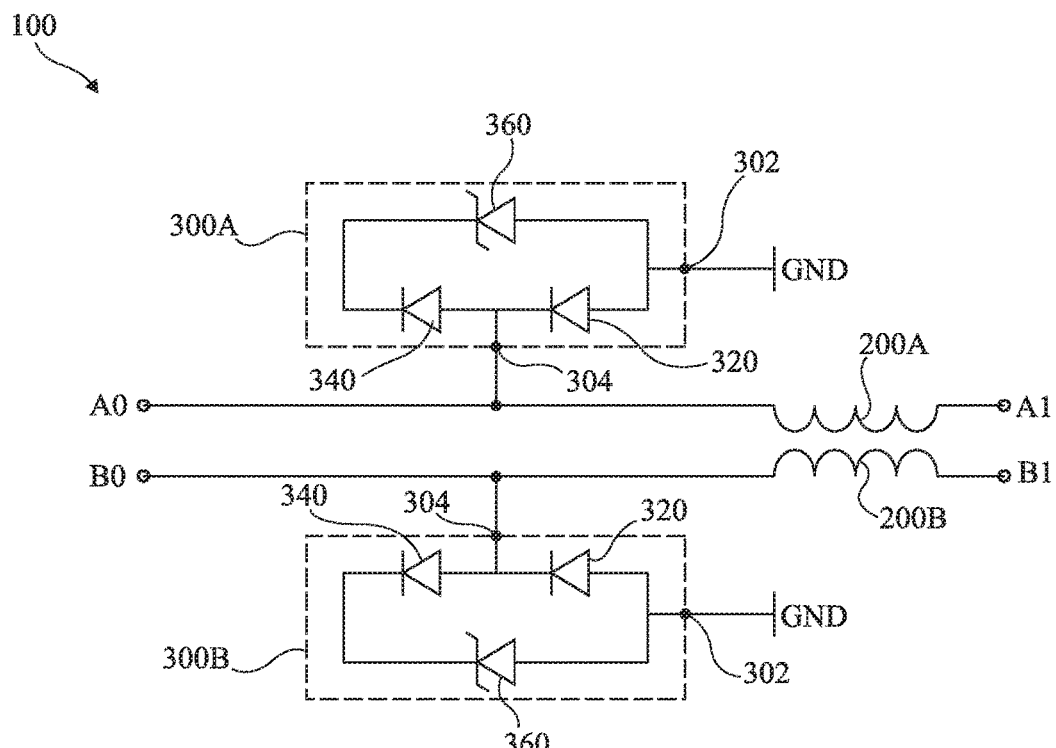
FIG. 1 schematically illustrates a protection and filtering device, comprising two components for protection against electrostatic discharges.

The same elements have been designated with the same reference numerals in the various drawings and, further, the various drawings are not to scale. For clarity, only those steps and elements which are useful to the understanding of the described embodiments have been shown and are detailed. In particular, the electronic circuits to be protected are neither shown, nor detailed, the described embodiments being compatible with current electronic circuits utilizing protection against electrostatic discharges.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the concerned element in the cross-section views, it being understood that, in practice, the described devices may be oriented differently. Unless otherwise specified, expressions "approximately", "substantially", and "in the order of" mean to within 10%, preferably to within 5%.

In the present description, the term "connected" designates a direct electric connection between two elements, while the term "coupled", when it relates to an electric connection, designates an electric connection between two elements which may be direct or via one or a plurality of passive or active components, such as resistors, capacitors, inductances, diodes, transistors, etc.

FIG. 1 schematically illustrates a device 100 for protection against electrostatic discharges and for filtering of electromagnetic disturbances.

Device 100 comprises two input terminals A0 and B0 and two output terminals A1 and B1. Terminals A1 and B1 are connected to an electronic circuit to be protected.

Device 100 comprises two inductive elements 200A and 200B. Inductive element 200A couples terminal A1 to terminal A0. Inductive element 200B couples terminal B1 to terminal B0. Inductive elements 200A and 200B are magnetically coupled and thus form a transformer. The transformation ratio of the transformer is preferably on the order of one, preferably equal to 1.

In operation, inductive elements 200A and 200B block common-mode electromagnetic disturbances. Inductive elements 200A and 200B enable to conduct toward the electronic circuit signals defined by differential modes between terminals A0 and B0. Device 100 plays the role of a common-mode filter (CMF).

Device 100 further comprises two components 300A and 300B for protection against electrostatic discharges. Components 300A and 300B respectively couple terminals A0 and B0 to a node of application of a reference potential, for example, a ground GND.

Each of components 300A and 300B comprises a node 304 and a node 302. Node 304 is connected to the considered terminal A0 or B0. Node 302 is, for example, connected to ground. In each protection component, a diode 320 has its cathode coupled to node 304 and its anode coupled to node 302. In parallel with diode 320, a diode 340 and a diode 360 in series couple node 304 to node 302. Diodes 340 and 360 have their cathodes interconnected, and their anodes respectively connected to nodes 304 and 302. Diode 360 is an avalanche diode, for example, a Zener diode, or a "Transil"-type (transient-voltage-suppression) diode. Such a diode is designed to have an avalanche voltage, for example, of a value smaller than 30 V, preferably smaller than 10 V.

Device 100 is provided so that in normal operation, the potentials of terminals A0 and B0 are positive. In the occurrence of an electrostatic discharge tending to increase the potential of terminal A0 or B0, the discharge is drained off to ground by diodes 340 and 360. In the case of an electrostatic discharge tending to make the potential of terminal A0 or B0 negative, the discharge is drained off to ground by diode 320.

Figure 2:
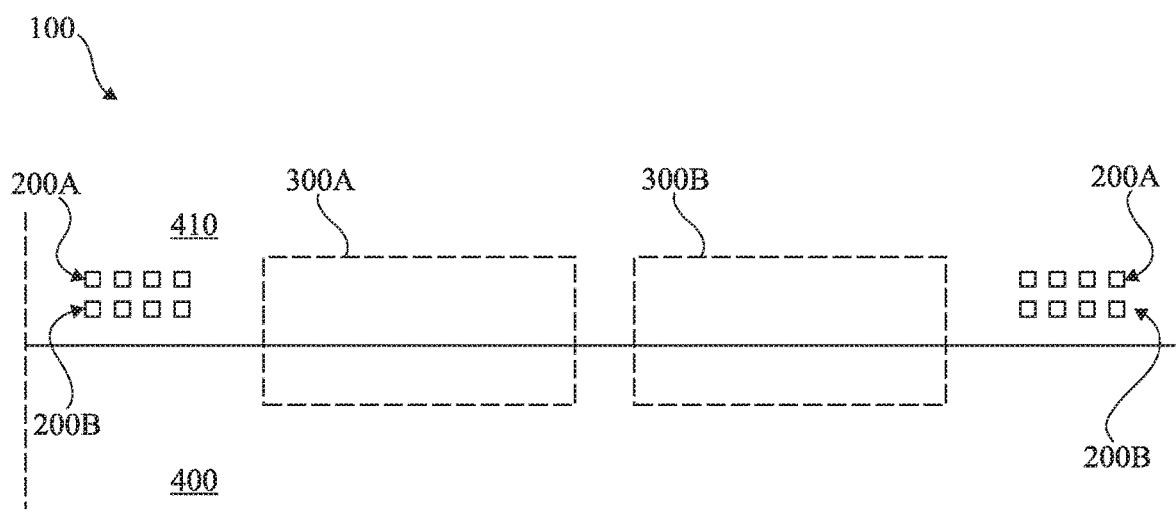
FIG. 2 is a simplified cross-section view of the device of FIG. 1.

FIG. 2 is a simplified cross-section view of the device of FIG. 1. Components 300A and 300B are formed inside and on top of a substrate 400, for example, a wafer of a semiconductor such as silicon. Inductive elements 200A and 200B each comprise a conductive track arranged in insulator layers 410, not shown in detail, covering substrate 400. The track of each inductive element, for example, runs several times, four turns being shown as an example. The inductive elements 200A, 200B may be disposed around the location of the components 300A and 300B, or preferably outside the location of the components 300A and 300B. The tracks of the inductive elements are stacked, which provides the magnetic coupling between these elements. The various connections, not shown, between inductive elements 200A, 200B and components 300A, 300B are typically formed by conductive tracks in insulator layers 410.

Figure 3:
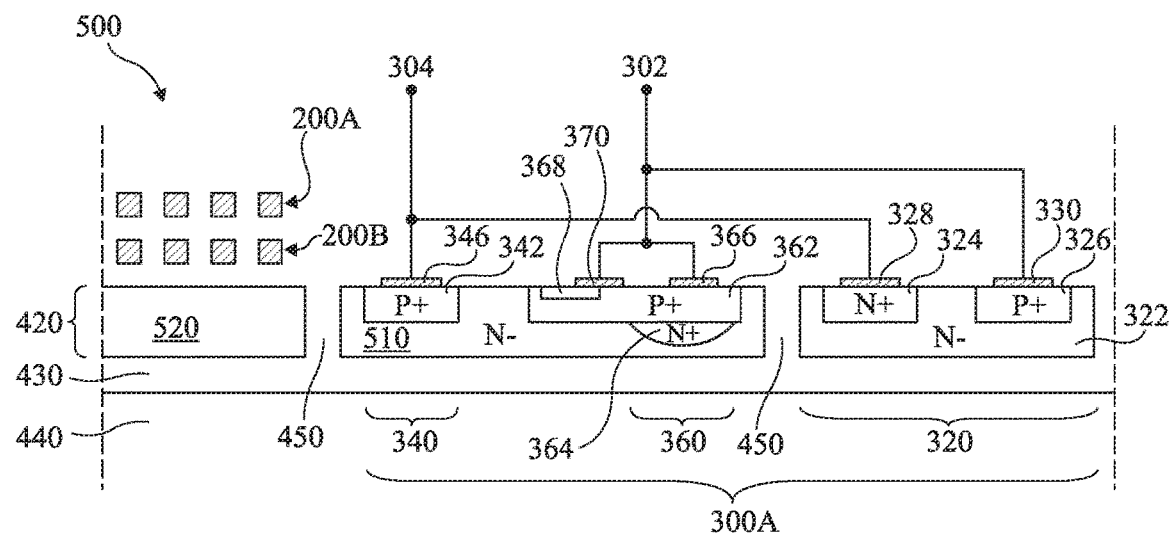
FIG. 3 is a simplified cross-section view illustrating a portion of an embodiment of a filtering device ensuring protection against electrostatic discharges.

FIG. 3 is a simplified cross-section view illustrating a portion of an embodiment of a device 500 for protection against electrostatic discharges of the type of device 100 of FIGS. 1 and 2. FIG. 3 corresponds to an enlargement of the left-hand portion of FIG. 2. In particular, device 500 comprises inductive elements 200A and 200B and components 300A and 300B of the above-described type. Only component 300A is shown and detailed hereafter, since component 300B may be similar to component 300A, for example, symmetrical.

A P-type doped semiconductor region 342 defines the anode of diode 340. A P-type doped semiconductor region 362 defines the anode of avalanche diode 360. A semiconductor region 510, for example, of type N, common to the two diodes 340 and 360, defines the interconnected cathodes of diodes 340 and 360.

Regions 342 and 362 are separate and located in the upper portion of semiconductor region 510. Regions 342 and 362 are thus located on the side of a same surface of semiconductor region 510, a portion of semiconductor region 510 extending between regions 342 and 362. Avalanche diode 360 may comprise a region 364 more heavily N-type doped than region 510, for example, located under region 362. Regions 342 and 362 are, for example, topped with respective contacts 346 and 366 connecting regions 342 and 362 respectively to nodes 304 and 302.

Such a layout of the semiconductor regions defining diode 340 and avalanche diode 360 enables limiting of the stray capacitance of the series coupling, in particular when region 510 is depleted in normal operation. Such a stray capacitance may be low, for example, smaller than 0.3 pF, even for large surface areas of regions 342 and 362, for example, greater than 15,000 $\mu m^2$. Thereby, device 500 enables coupling output terminals A1 and B1 to a signal having a particularly high frequency, for example, greater than 3 GHz. Further, decreasing the stray capacitance enables increasing of the rapidity of the device during the occurrence of an electrostatic discharge. Further, the device enables to drain off to ground currents of high intensities, for example, greater than 10 A, which enables reinforcement of the protection level during the occurrence of an electrostatic discharge.

As an example, semiconductor region 510 has a low N type doping level, for example, so that its electric resistivity at 25° C. is greater than 100 Ω·cm.

Semiconductor region 510 is, for example, a portion of a semiconductor layer 420 on top of and in contact with an insulating layer 430. Insulating layer 430 covers and is, for example, in contact with a support 440. Region 510 is delimited by insulating trenches 450 filled with an electric insulator, for example, silicon oxide. The device can then be obtained from a structure of semiconductor-on-insulator type, for example, of silicon-on-insulator or SOI type comprising support 440, insulating layer 430, for example, made of silicon oxide, and layer 420. As an example, the thickness of layer 420 is in the range from 1 to 15 µm, preferably in the order of 10 µm. The thickness of layer 430 is, for example, in the range from 0.2 µm to 2 µm.

Preferably, support 440 is electrically insulating, for example, made of silicon oxide or of sapphire, or of a semiconductor of high resistivity, for example, greater than 1,500 Ω·cm.

Region 510 may then be depleted in operation across its entire thickness under the region 342, which limits the stray capacitance of the series coupling of diodes 340 and 360. Further, the provision of an electrically insulating or high-resistivity support enables to limit the stray capacitances between the series coupling of the diodes and support 440. This enables the device to couple signals up to particularly high frequencies, and ensures the rapidity of the device during the occurrence of an electrostatic discharge.

It should further be noted that problems of exodiffusion of dopant atoms which would risk occurring from the support if the support was made of a doped semiconductor which would be less resistive than a semiconductor of high resistivity are avoided.

An N-type doped region 368 may be provided in the upper portion of region 362. Region 368 is, for example, located outside of the portion of region 362 covered with contact 366. Region 368 is, for example, located in a portion of region 362 located on the side of region 342. Region 368 is, for example, not located above region 364. Region 368 is, for example, more heavily doped than region 362. A contact 370 covers both a portion of region 368 and a portion of region 362 and electrically couples the two regions to node 302.

A Schockley diode has thus been defined by regions 342 (P), 510 (N), 362 (P), and 368 (N). During the occurrence of an electrostatic discharge, the Schockley diode starts conducting, which enables providing a higher protection level than in the absence of doped region 368. Further, this enables draining an electrostatic discharge to ground without this discharge being absorbed by the association in series of diodes 340 and 360. The risk of these diodes being damaged by the discharge is thus avoided.

In the right-hand portion of FIG. 3, diode 320 of device 300 comprises, as an example, an N-type region, or area 322 of low doping level, for example, of same resistivity as region 510. Separate N-type regions or areas 324 and P-type regions 326 more heavily doped than region 322 are located in the upper portion of region 322. Regions 324 and 326 are, for example, topped with respective contacts 328 and 330 connecting regions 324 and 326 respectively to nodes 304 and 302.

As an example, for a structure of semiconductor-on-insulator type comprising layers 430 and 420 on support 440, regions 510 and 322 are preferably portions of semiconductor layer 420.

The layout of the regions defining diode 320 enables, due to the fact that region 322 may be depleted in normal operation, limitation of the stray capacitance of diode 320. Further, the provision of an electrically-insulating or high-resistivity support 440 enables limiting stray capacitances between the diode and the support.

In the left-hand portion of FIG. 3, stacked inductive elements 200A and 200B are as an example arranged on a portion 520 of semiconductor layer 420. Portion 520 is located on insulating layer 430 and, for example, has a low N-type doping level. Portion 520 is, for example, of same resistivity as region 510 and originates from the same semiconductor layer 420 of a semiconductor-on-insulator structure.

The provision, under the stacked inductive elements, of region 520 of high electric resistivity, of insulator 430, and of electrically-conductive or high-resistivity support 440, enables limiting the stray capacitance between the inductive elements and the support. The device 500 couples signals in differential mode and blocks common-mode electromagnetic disturbances up to high frequencies, for example, greater than 3 GHz.

Figure 4:
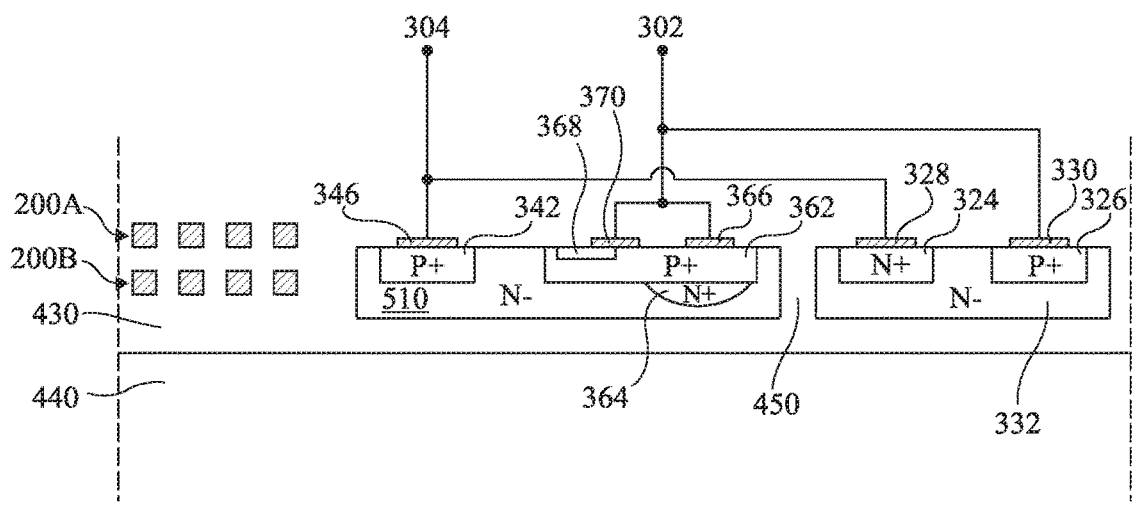
FIG. 4 is a simplified cross-section view illustrating a portion of an alternative embodiment of the device of FIG. 3.

FIG. 4 is a simplified cross-section view illustrating a portion of an alternative embodiment of the device of FIG. 3. In the variation of FIG. 4, portion 520 of semiconductor layer 420 has been removed. A step of etching of this portion may, for example, be provided. This leads to an absence of a semiconductor portion between the inductive elements 200A and 200B and the insulating layer 430 of the SOI structure. The inductive elements are located on electric insulators only, or on electric insulators and the high resistivity support 440 only. As a result, the device 500 couples signals in differential mode and blocks common-mode electromagnetic disturbances up to particularly high frequencies.

Figure 5:
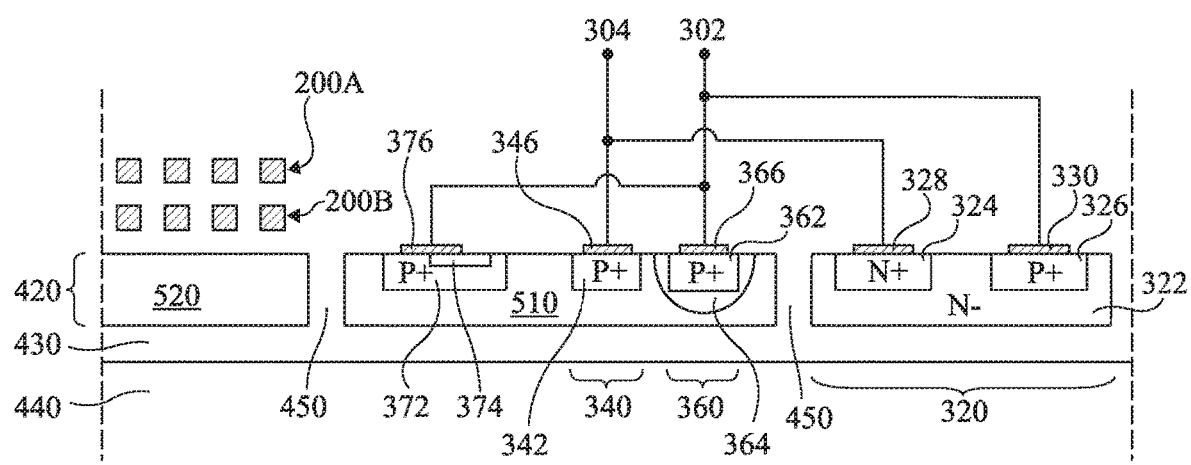
FIG. 5 is a simplified cross-section view illustrating a portion of another alternative embodiment of the device of FIG. 3.

FIG. 5 is a simplified cross-section view illustrating another embodiment of the device of FIG. 3. The device of FIG. 5 differs from the device of FIG. 3 in that the region 510 further extends under and between a P-type doped region 372 and the P-type doped region 342 of the diode 340, the region 368 is replaced by an N-doped region 374 located in an upper portion of the region 372, preferably on the side closest to the region 342, and the contact 370 is replaced by a contact 376, covering both a portion of the region 372 and a portion of the region 374, and electrically coupling both regions 372 and 376 to the node 302.

As an example, the N-type region 364 is located under and around the region 362.

The regions 342 (P), 510 (N), 372 (P) and 374 (N) thus define a Schockley diode that replaces and plays the role of the Schockley diode of the device of FIG. 3. The protection level provided by the device of FIG. 5 is higher than the protection level provided by the device of FIG. 3.

Specific embodiments have been described. Various alterations, modifications, and improvements will occur to those skilled in the art. In particular, a single protection component of the type of component 300A coupling a terminal to ground, and providing protection against electrostatic discharges reaching this terminal may be provided. A filtering inductive element similar to element 200A may then be provided. Further, diode 320 may be replaced with any diode adapted to the protection against electrostatic discharges.

Further, the doping types may be exchanged in components 300A and/or 300B. The sign of the voltages and the connection direction of components 300A and/or 300B between terminals A0 and/or B0 and the ground may then be modified.

Various embodiments with various variations have been described hereabove. It should be noted that those skilled in the art may combine various elements of these various embodiments and variations without showing any inventive step.

Finally, the practical implementation of the described embodiments is within the abilities of those skilled in the art based on the functional indications given hereabove.

The invention claimed is:

1. An electronic component, comprising:
    first and second semiconductor regions; and
    a third semiconductor region arranged under the first and second semiconductor regions and further extending continuously between the first and second semiconductor regions in an unbroken fashion to separate the first semiconductor region from the second semiconductor region;

wherein the first and third semiconductor regions define electrodes of a first diode, the first diode being an avalanche diode; and wherein the second and third semiconductor regions define electrodes of a second diode.

2. The electronic component of claim 1, wherein the third semiconductor region has a lower doping level than the first and second semiconductor regions.

3. The electronic component of claim 1, wherein the third semiconductor region is located on an electrically insulating layer.

4. An electronic component, comprising:

first and second semiconductor regions; and a third semiconductor region arranged under the first and second semiconductor regions and further extending between the first and second semiconductor regions to separate the first semiconductor region from the second semiconductor region;

wherein the first and third semiconductor regions define electrodes of a first diode, the first diode being an avalanche diode;

wherein the second and third semiconductor regions define electrodes of a second diode;

wherein the third semiconductor region is located on an electrically insulating layer; and wherein the electrically insulating layer covers a support having an electric resistivity greater than 1,500 Ω/cm.

5. The electronic component of claim 4, wherein the support is a semiconductor wafer.

6. An electronic component, comprising:

first and second semiconductor regions;

a third semiconductor region arranged under the first and second semiconductor regions and further extending between the first and second semiconductor regions to separate the first semiconductor region from the second semiconductor region;

wherein the first and third semiconductor regions define electrodes of a first diode, the first diode being an avalanche diode;

wherein the second and third semiconductor regions define electrodes of a second diode; and a third diode connected in parallel with the first and second diodes.

7. The electronic component of claim 6, wherein the third diode comprises:

first and second semiconductor areas; and a third semiconductor area located under the first and second semiconductor areas and further extending between the first and second semiconductor areas to separate the first semiconductor area from the second semiconductor area;

wherein the first and second semiconductor areas define electrodes of the third diode; and wherein the first and second semiconductor areas are more heavily doped than the third semiconductor area.

8. An electronic component, comprising:

first and second semiconductor regions;

a third semiconductor region arranged under the first and second semiconductor regions and further extending between the first and second semiconductor regions to separate the first semiconductor region from the second semiconductor region;

wherein the first and third semiconductor regions define electrodes of a first diode, the first diode being an avalanche diode;

wherein the second and third semiconductor regions define electrodes of a second diode; and under the first semiconductor region, an additional semiconductor region of a same conductivity type as the third semiconductor region and more heavily doped than the third semiconductor region.

9. An electronic component, comprising:

first and second semiconductor regions;

a third semiconductor region arranged under the first and second semiconductor regions and further extending between the first and second semiconductor regions to separate the first semiconductor region from the second semiconductor region;

wherein the first and third semiconductor regions define electrodes of a first diode, the first diode being an avalanche diode;

wherein the second and third semiconductor regions define electrodes of a second diode; and a fourth semiconductor region that is located above the third semiconductor region and which defines an electrode of a Schockley diode, and wherein another electrode of the Schockley diode is defined by the second semiconductor region.

10. The electronic component of claim 9, wherein the fourth semiconductor region is not located above the additional semiconductor region.

11. The electronic component of claim 9, wherein the fourth semiconductor region is located in an upper portion of the first semiconductor region.

12. The electronic component of claim 9, further including a fifth semiconductor region of a same type of conductivity as the first and second semiconductor regions, wherein the third semiconductor region extends below and between the second and fifth semiconductor regions to separate the second semiconductor region from the fifth semiconductor region, and wherein the fourth semiconductor region is located in an upper portion of the fifth semiconductor region.

13. The electronic component of claim 12, further comprising:

a first contact on the first semiconductor region; and a second contact connected to the first contact and located astride the fourth semiconductor region and the first semiconductor region or the fifth semiconductor region.

14. An electronic component, comprising;

first and second semiconductor regions;

a third semiconductor region arranged under the first and second semiconductor regions and further extending between the first and second semiconductor regions to separate the first semiconductor region from the second semiconductor region;

wherein the first and third semiconductor regions define electrodes of a first diode, the first diode being an avalanche diode;

wherein the second and third semiconductor regions define electrodes of a second diode; and an inductive element coupled to an electrode of the second diode.

15. The electronic component of claim 14, wherein the third semiconductor region is located on an electrically insulating layer and wherein the inductive element is arranged above the electrically insulating layer.

16. The electronic component of claim 15, wherein no semiconductor portion is located between the electrically insulating layer and the inductive element.

17. The electronic component of claim 15, wherein the inductive element is located above a portion of a semiconductor layer arranged on the electrically insulating layer.

18. A device for protection against electrostatic discharges comprising at least one electronic component according to claim 1.

19. A circuit comprising an electronic component according to claim 1.

20. A device for common mode filtering and protection against electrostatic discharges, the device comprising:
a first circuit comprising:
a first electronic component comprising:
first and second semiconductor regions; and
a third semiconductor region arranged under the first and second semiconductor regions and further extending between the first and second semiconductor regions to separate the first semiconductor region from the second semiconductor region;
wherein the first and third semiconductor regions define electrodes of a first diode, the first diode being an avalanche diode; and
wherein the second and third semiconductor regions define electrodes of a second diode; and
a first inductive element coupled to an electrode of the second diode; and
a second circuit comprising:
a second electronic component comprising:
fourth and fifth semiconductor regions; and
a sixth semiconductor region arranged under the fourth and fifth semiconductor regions and further extending between the fourth and fifth semiconductor regions to separate the fourth semiconductor region from the fifth semiconductor region;
wherein the fourth and sixth semiconductor regions define electrodes of a third diode, the third diode being an avalanche diode; and
wherein the fifth and sixth semiconductor regions define electrodes of a fourth diode; and
a second inductive element coupled to an electrode of the fourth diode;
wherein the first and second inductive elements are mutually magnetically coupled.

21. The device of claim 20, wherein the first inductive element of the first circuit comprises first conductive tracks, and the second inductive element of the second circuit comprises second conductive tracks stacked on the first conductive tracks.

22. The electronic component of claim 1, wherein the third semiconductor region is in contact with bottom faces of the first and second semiconductor regions, and is in contact with sides of the first and second semiconductor regions.

* * * * *